United States Patent
Yu et al.

(10) Patent No.: US 7,923,291 B2
(45) Date of Patent: Apr. 12, 2011

(54) METHOD OF FABRICATING ELECTRONIC DEVICE HAVING STACKED CHIPS

(75) Inventors: Hae-Jung Yu, Anyang-si (KR);
Eun-Chul Ahn, Yongin-si (KR);
Tae-Gyeong Chung, Suwon-si (KR);
Nam-Seog Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/458,923

(22) Filed: Jul. 28, 2009

(65) Prior Publication Data
US 2010/0022051 A1   Jan. 28, 2010

(30) Foreign Application Priority Data
Jul. 28, 2008   (KR) .................... 10-2008-0073666

(51) Int. Cl.
*H01L 21/66* (2006.01)
*H01L 21/00* (2006.01)
(52) U.S. Cl. ............... 438/106; 438/15; 438/21; 438/51
(58) Field of Classification Search .................. 438/15, 438/25, 51, 61
See application file for complete search history.

(56) References Cited

U.S. PATENT DOCUMENTS

| | | | |
|---|---|---|---|
| 7,541,635 B2 * | 6/2009 | Torek et al. | 257/306 |
| 2001/0040793 A1 * | 11/2001 | Inaba | 361/749 |
| 2002/0114143 A1 * | 8/2002 | Morrison et al. | 361/749 |
| 2004/0099938 A1 * | 5/2004 | Kang et al. | 257/686 |
| 2005/0167817 A1 * | 8/2005 | Damberg | 257/698 |
| 2005/0227412 A1 * | 10/2005 | Hsuan et al. | 438/107 |
| 2005/0233496 A1 * | 10/2005 | Haba et al. | 438/109 |
| 2005/0280138 A1 * | 12/2005 | Shrivastava et al. | 257/697 |
| 2006/0209515 A1 * | 9/2006 | Moshayedi | 361/715 |
| 2006/0258044 A1 | 11/2006 | Meyer et al. | |
| 2006/0278962 A1 * | 12/2006 | Gibson | 257/668 |
| 2006/0286717 A1 * | 12/2006 | Solberg et al. | 438/113 |
| 2007/0230154 A1 * | 10/2007 | Nakayama | 361/810 |
| 2008/0009096 A1 * | 1/2008 | Hwang | 438/108 |
| 2008/0122113 A1 * | 5/2008 | Corisis et al. | 257/777 |
| 2009/0016033 A1 * | 1/2009 | Chow et al. | 361/749 |

FOREIGN PATENT DOCUMENTS

| | | |
|---|---|---|
| JP | 2004-342862 | 12/2004 |
| KR | 10-0660900 | 12/2006 |

\* cited by examiner

*Primary Examiner* — Matthew C Landau
*Assistant Examiner* — James M Mitchell
(74) *Attorney, Agent, or Firm* — Harness, Dickey & Pierce, P.L.C.

(57) ABSTRACT

A method of fabricating an electronic device having stacked chips is provided. The method includes forming a plurality of chips arranged in a row direction and at least one chip arranged in a column direction. A molding layer is formed between the chips. Grooves are formed in the molding layer between the chips arranged in the row direction. Conductive interconnections are formed on the substrate having the grooves. The substrate is sawn along an odd- or even-numbered one of the grooves to be separated into a plurality of unit substrates. At least one of the separated unit substrates is folded along an unsawn groove of the grooves.

19 Claims, 6 Drawing Sheets

METHOD OF FABRICATING ELECTRONIC DEVICE HAVING STACKED CHIPS

CROSS-REFERENCE TO RELATED APPLICATION

This non-provisional U.S. application claims priority to Korean Patent Application No. 10-2008-0073666, filed on Jul. 28, 2008, in the Korean Intellectual Property Office, the entire contents of which are herein incorporated by reference.

BACKGROUND

1. Field

Example embodiments relate to an electronic device, and more particularly, to a method of fabricating an electronic device having stacked chips.

2. Description of Related Art

In response to downsizing of electronic devices and demand for various functions, multichip packages including a plurality of semiconductor chips, for example, a stacked semiconductor package, have been developed and applied. The stacked semiconductor package may improve system integration by stacking various devices including flash, SRAM, DRAM, analog and logic devices. Also, such a stacked semiconductor package may enable implementation of a high-capacity memory device at a low cost, and be advantageous in increasing operating speed and decreasing power consumption according to reduction of a signal transmission path.

SUMMARY

Example embodiments provide a method of fabricating an electronic device capable of simultaneously forming interconnections for each stacked chip and an insulating material protecting the stacked chips in one process.

According example embodiments, a method of fabricating an electronic device having stacked chips is provided. The method includes: forming first and second chips spaced apart from each other on a substrate, forming interconnections electrically connecting the first and second chips; and folding the substrate between the first and second chips.

According to example embodiments, the method may further include forming a molding layer between the first and second chips before forming the interconnections and forming a groove between the first and second chips before forming the interconnections.

In an example embodiment, the groove may have a slanted sidewall tapering to a lower region from an upper region.

According to example embodiments, the method may further include adhering a first bottom surface of the substrate to a second bottom surface of the substrate to form a stacked semiconductor package, where the first chip may be disposed on the first bottom surface and the second chip may be disposed on the second bottom surface.

According to example embodiments, the method may further include folding the substrate to form a space between first and second bottom surfaces of the substrate, where the first chip may be disposed on the first bottom surface and the second chip may be disposed on the second bottom surface.

In an example embodiment, an electronic part may be formed in the space formed between the first and second bottom surfaces of the substrate.

According to example embodiments, a conductive structure may be further formed on a portion of the interconnection where a stress may be applied due to the substrate being folded.

According to example embodiments, another conductive structure electrically connecting the interconnections on the first and second chips at the folded portion of the substrate may be further formed. Moreover, the interconnections may be spaced apart from each other and disposed on opposite sides of the folded substrate.

According to example embodiments, a printed circuit board may be prepared, and the folded substrate may be mounted on or in the printed circuit board.

According to example embodiments, a method of fabricating an electronic device is provided which is capable of simultaneously forming interconnections for each stacked chip and an insulating material protecting the stacked chips in one process. This method may include forming a plurality of chips arranged in a row direction and at least one chip arranged in a column direction on a substrate. A molding layer may be formed between at least one of plurality of the chips arranged in the row direction and the at least one chip arranged in a column direction. Also, grooves may be formed in the molding layer between the plurality of chips arranged in the row direction, respectively. Conductive interconnections are formed on the portions of the substrate having the grooves. Further, the substrate may be sawn along at least one of an odd-numbered and even-numbered groove of the grooves to separate the substrate into a plurality of unit substrates. Also, at least one of the separated unit substrates may be folded along an unsawn groove of the grooves, when the unsawn groove may not be sawed.

According to example embodiments, forming at least one chip arranged in the column direction on the substrate may include forming a plurality of chips arranged in the column direction on the substrate. Also, sawing the substrate may include sawing the substrate between the plurality of chips arranged in the column direction.

According to example embodiments, each groove may have a slanted sidewall tapering to a lower region from an upper region.

According to example embodiments, the interconnections may cross each groove and may electrically connect the plurality of chips disposed at first and second sides of each groove.

In an example embodiment, a first bottom surface of the at least one of the folded unit substrates may be adhered to a second bottom surface of the at least one of the folded unit substrates.

In an example embodiment, an electronic part may be formed on the at least one of the folded unit substrates.

According to example embodiments, a conductive structure may be formed on portions of the interconnections where a stress may be applied due to the at least one of the unit substrates being folded.

According to example embodiments, another conductive structure electrically connecting interconnections facing and spaced apart from each other may be formed between the interconnections disposed on opposite sides of the at least one of the unit substrates and spaced apart from each other when the at least one of the unit substrates may be folded.

According to example embodiments, among the grooves, the folded groove may be formed to have a first width, and the sawn groove may be formed to have a second width smaller than the first width. Moreover, folding the at least one of the unit substrates may include disposing first and second chips of the plurality of chips at opposite sides of the folded groove. Also, folding the at least one of the unit substrates may include forming a space where a first bottom surface of the at least one of the unit substrates having the first chip may be spaced a first distance apart from a second bottom surface of the at least one of the unit substrates having the second chip.

In an example embodiment, a part or all of an electronic part may be inserted into the space.

In an example embodiment, a conductive structure electrically connecting at least one of the interconnections on the plurality of chips arranged in the row direction may be formed with the electronic part.

According to example embodiments, a method of fabricating an electronic device is provided, which may include chips disposed on opposite sides of unit substrates whose bottom surfaces are adhered. This method may include forming a plurality of chips arranged in a row direction and at least one chip arranged in a column direction on a substrate. A molding layer may be formed between plurality of chips and the at least one chip. Further, grooves may be formed in the molding layer between the plurality of chips arranged in the row direction. Also, interconnections may cross one first groove of the grooves and electrically connect the plurality of chips adjacent to the first groove. The substrate may be sawn along the first groove to form unit substrates. Further, bottom surfaces of the sawn unit substrates may be adhered to each other. Also, a conductive structure may electrically connect interconnections on at least one sidewall of the adhered unit substrates.

According to example embodiments, forming the at least one chip arranged in the column direction on the substrate may include forming a plurality of chips arranged in the column direction on the substrate. Also, the method may further include sawing the substrate between the plurality of chips arranged in the column direction on the substrate.

In an example embodiment, each groove of the grooves may have a slanted sidewall tapering to a lower region from an upper region.

In an example embodiment, forming the at least one conductive structure may further include forming conductive structures electrically connecting the interconnections facing each other on the at least one sidewall of the adhered unit substrates.

BRIEF DESCRIPTION OF THE DRAWINGS

The above and/or other features and advantages will become more apparent and more readily appreciated by describing in detail example embodiments taken in conjunction with reference to the attached drawings in which.

DETAILED DESCRIPTION OF EXAMPLE EMBODIMENTS

Figure 1A:
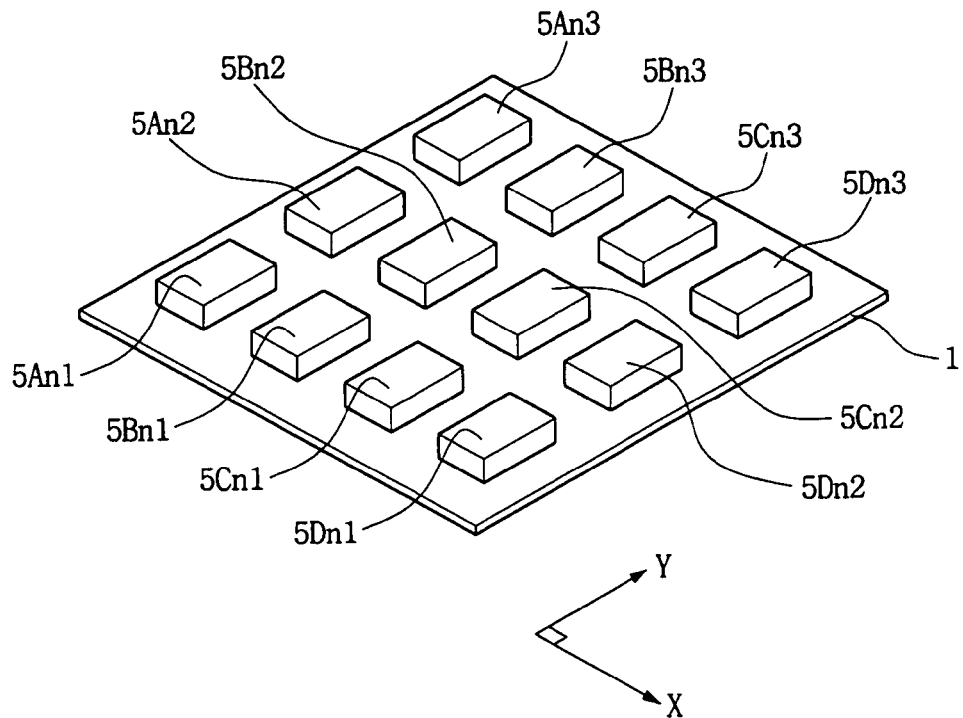
FIGS. 1A to 1E illustrate an electronic device according to example embodiments.

Various example embodiments will now be described more fully with reference to the accompanying drawings in which some example embodiments are shown. In the drawings, the thicknesses of layers and regions may be exaggerated for clarity.

However, specific structural and functional details disclosed herein are merely representative for purposes of describing example embodiments. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

Also, the use of the words "compound," "compounds," or "compound(s)," refer to either a single compound or to a plurality of compounds. These words are used to denote one or more compounds but may also just indicate a single compound.

In the figures, if a layer is formed on another layer or a substrate, it means that the layer is directly formed on another layer or a substrate, or that a third layer is interposed therebetween. In the following description, the same reference numerals denote the same elements.

Although example embodiments have been disclosed for illustrative purposes, those skilled in the art will appreciate that various modifications, additions and substitutions are possible, without departing from the scope and spirit of the invention as disclosed in the accompanying claims.

Figure 2:
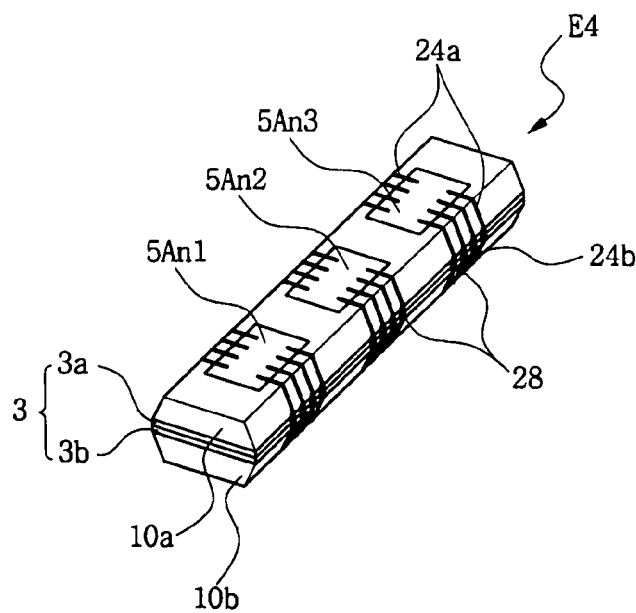
FIG. 2 is an example perspective view of an electronic device according to example embodiments.
Figure 3A:
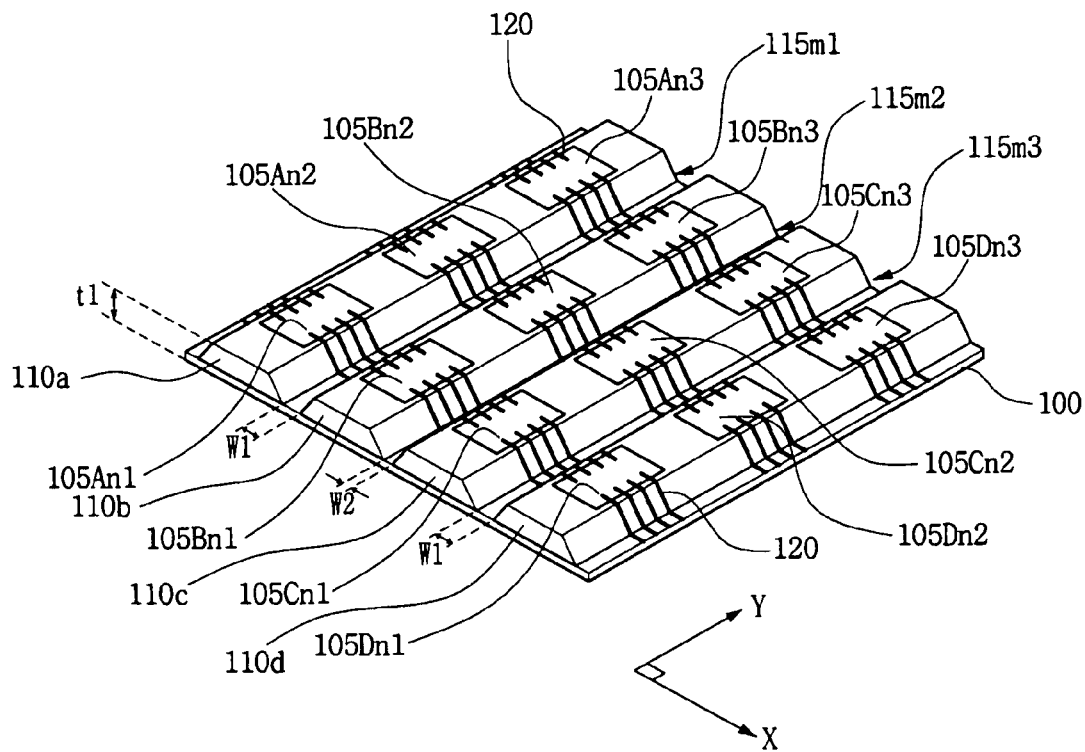
FIGS. 3A to 3C illustrate an electronic device according to example embodiments.
Figure 3B:
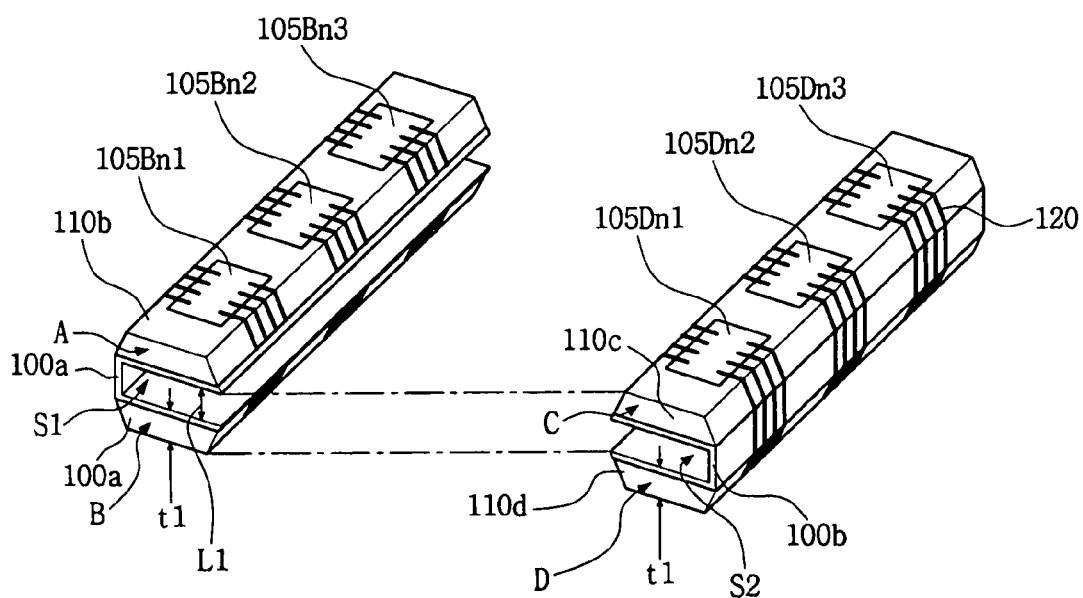
Figure 3C:
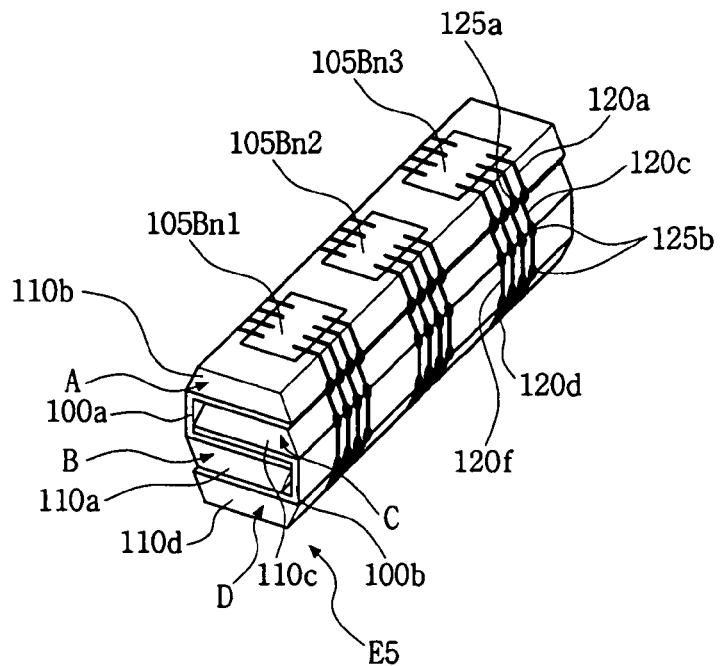
Figure 4:
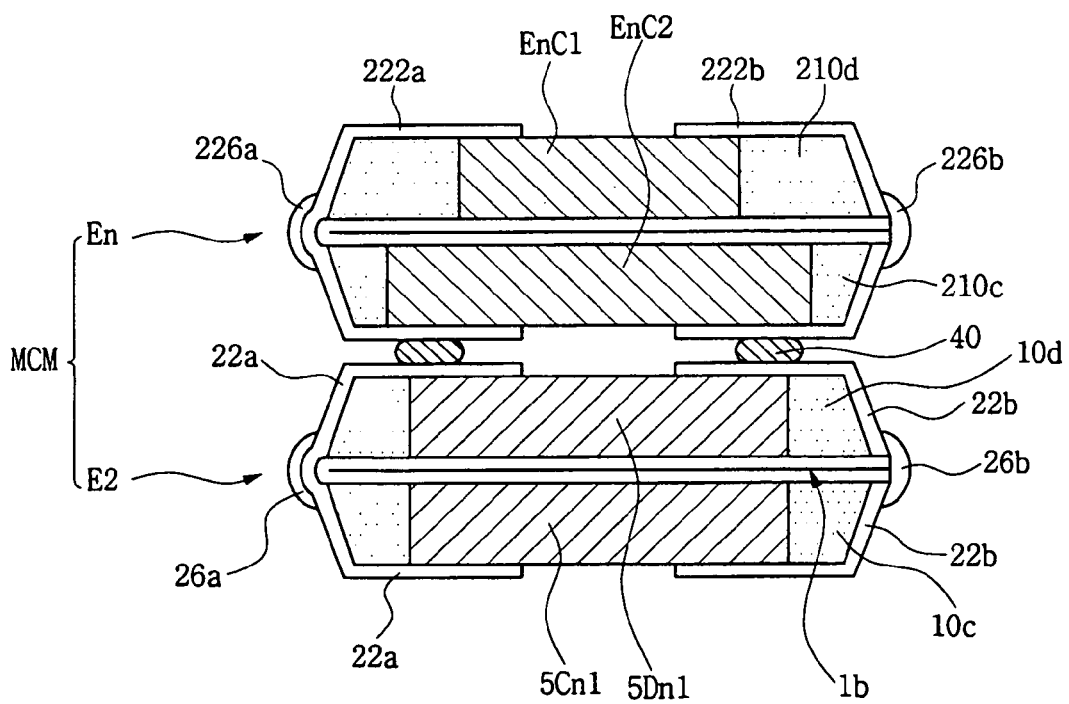
FIG. 4 is an example cross-sectional view of an electronic device according to example embodiments.
Figure 5:
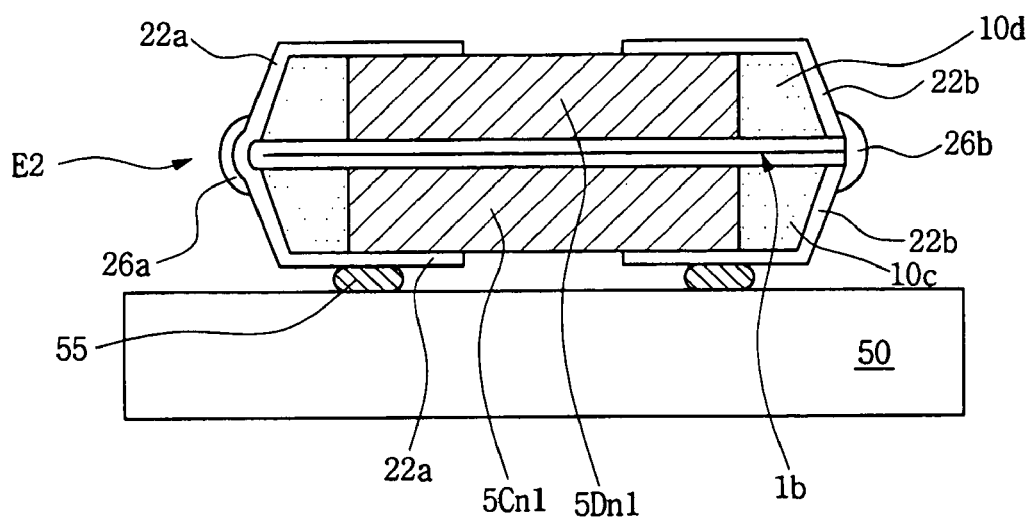
FIG. 5 is an example cross-sectional view of an electronic device according to example embodiments.
Figure 6:
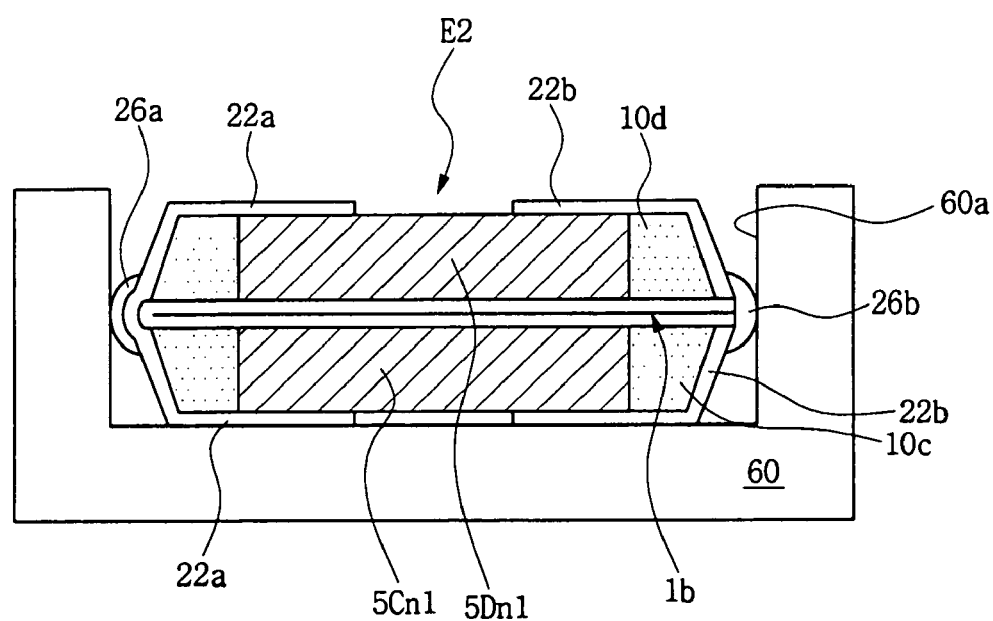
FIG. 6 is an example cross-sectional view of an electronic device according to example embodiments.

FIGS. 1A to 1E illustrate an electronic device according to example embodiments; FIG. 2 is an example perspective view of an electronic device according to example embodiments; FIGS. 3A to 3C illustrate an electronic device according to example embodiments; FIG. 4 is an example cross-sectional view of an electronic device according to example embodiments; FIG. 5 is an example cross-sectional view of an electronic device according to example embodiments; and FIG. 6 is an example cross-sectional view of an electronic device according to example embodiments.

First, a method of fabricating an electronic device according to example embodiments will be described with reference to FIGS. 1A to 1E.

Referring to FIG. 1A, a plurality of chips 5An1, 5An2, 5An3; 5Bn1, 5Bn2, 5Bn3; 5Cn1, 5Cn2, 5Cn3; and 5Dn1, 5Dn2, 5Dn3 which are arranged in row (X) and column (Y) directions, may be formed on a substrate 1. The substrate 1 may be a rigid or flexible substrate. Among the plurality of chips 5An1, 5An2, 5An3; 5Bn1, 5Bn2, 5Bn3; 5Cn1, 5Cn2, 5Cn3; and 5Dn1, 5Dn2, 5Dn3, at least two chips may be arranged in the X direction, and at least one chip may be arranged in the Y direction. While example embodiments denote the plurality of chips as 5An1, 5An2, 5An3; 5Bn1, 5Bn2, 5Bn3; 5Cn1, 5Cn2, 5Cn3; and 5Dn1, 5Dn2, 5Dn3 as shown in FIGS. 1A-2, example embodiments are not limited thereto. Accordingly, a greater or lesser number of chips may be included in the plurality of chips 5An1, 5An2, 5An3; 5Bn1, 5Bn2, 5Bn3; 5Cn1, 5Cn2, 5Cn3; and 5Dn1, 5Dn2, 5Dn3.

The plurality of chips 5An1, 5An2, 5An3; 5Bn1, 5Bn2, 5Bn3; 5Cn1, 5Cn2, 5Cn3; and 5Dn1, 5Dn2, 5Dn3 may be formed on a semiconductor wafer such as a silicon wafer using a semiconductor process, and further bonded on the substrate 1. Thus, adjacent chips among the chips 5An1, 5An2, 5An3; 5Bn1, 5Bn2, 5Bn3; 5Cn1, 5Cn2, 5Cn3; and 5Dn1, 5Dn2, 5Dn3, for example, 5An1 and 5Bn1, may have equal or different functions. For example, the adjacent chips among the chips 5An1, 5An2, 5An3; 5Bn1, 5Bn2, 5Bn3; 5Cn1, 5Cn2, 5Cn3; and 5Dn1, 5Dn2, 5Dn3, which are bonded on the substrate 1, may be the same or different semiconductor chips. Accordingly, the adjacent chips among the chips 5An1, 5An2, 5An3; 5Bn1, 5Bn2, 5Bn3; 5Cn1, 5Cn2, 5Cn3; and 5Dn1, 5Dn2, 5Dn3 may have the same or different sizes. In addition, even when having the same size, the chips may have different characteristics.

Conductive pads (not shown) may be formed over the chips 5An1, 5An2, 5An3; 5Bn1, 5Bn2, 5Bn3; 5Cn1, 5Cn2, 5Cn3; and 5Dn1, 5Dn2, 5Dn3, respectively.

Figure 1B:
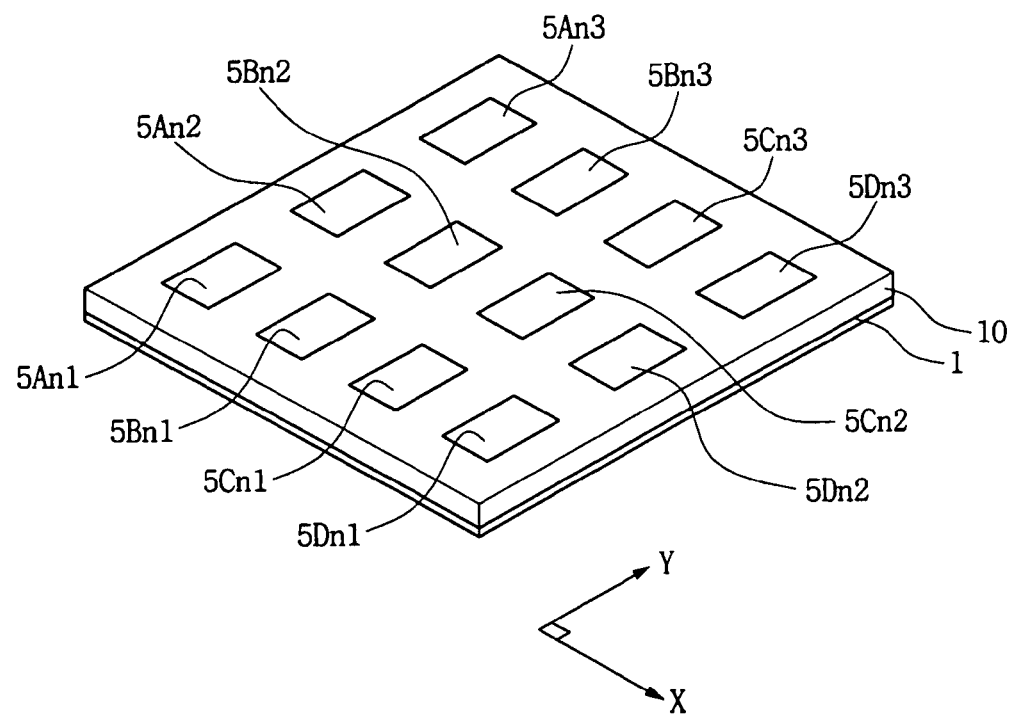

Referring to FIG. 1B, a molding layer 10 may be formed on the substrate having at least the chips 5An1, 5An2, 5An3; 5Bn1, 5Bn2, 5Bn3; 5Cn1, 5Cn2, 5Cn3; and 5Dn1, 5Dn2, 5Dn3. For example, forming the molding layer 10 may include forming an insulating material on the substrate having the chips 5An1, 5An2, 5An3; 5Bn1, 5Bn2, 5Bn3; 5Cn1, 5Cn2, 5Cn3; and 5Dn1, 5Dn2, 5Dn3 and planarizing the insulating material using a planarization technique such as an etch back technique until top surfaces of the chips 5An1, 5An2, 5An3; 5Bn1, 5Bn2, 5Bn3; 5Cn1, 5Cn2, 5Cn3; and 5Dn1, 5Dn2, 5Dn3 are exposed. The molding layer 10 may be formed of an epoxy compound.

Also, forming the molding layer 10 may include forming an insulating material layer, which fills spaces between the chips 5An1, 5An2, 5An3; 5Bn1, 5Bn2, 5Bn3; 5Cn1, 5Cn2, 5Cn3; and 5Dn1, 5Dn2, 5Dn3 and covers the top surfaces thereof to a predetermined thickness.

In addition, when conductive regions of the top surfaces of the chips 5An1, 5An2, 5An3; 5Bn1, 5Bn2, 5Bn3; 5Cn1, 5Cn2, 5Cn3; and 5Dn1, 5Dn2, 5Dn3 are not exposed, an etch process for exposing these conductive regions thereof may be performed after forming the molding layer 10.

Figure 1C:
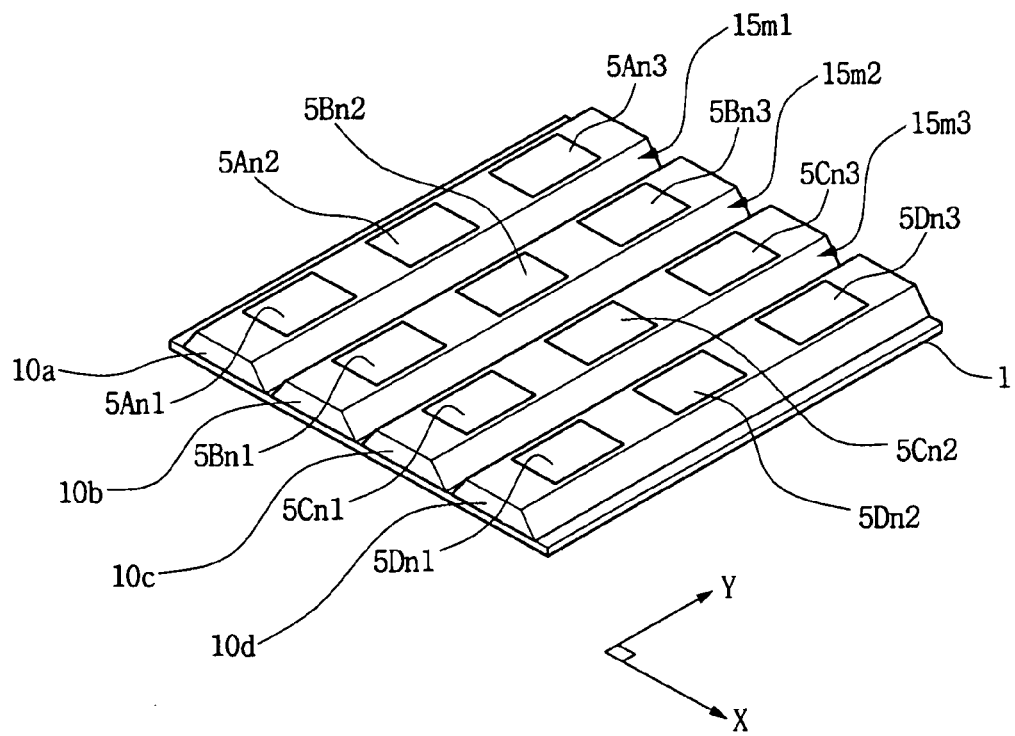

Referring to FIG. 1C, grooves 15m1, 15m2 and 15m3 may be formed between the chips arranged in the X direction among the chips 5An1, 5An2, 5An3; 5Bn1, 5Bn2, 5Bn3; 5Cn1, 5Cn2, 5Cn3; and 5Dn1, 5Dn2, 5Dn3. The grooves 15m1, 15m2 and 15m3 may be formed to taper to a lower region from an upper region thereof. For example, the grooves 15m1, 15m2 and 15m3 may be formed to have a slanted sidewall.

The grooves 15m1, 15m2 and 15m3 may pass through the molding layer 10 and divide the molding layer 10 into several molding patterns 10a, 10b, 10c and 10d. Thus, due to the grooves 15m1, 15m2, and 15m3, sidewalls of the chips 5An1 to 5An3 may be surrounded by the first molding pattern 10a, sidewalls of the chips 5Bn1 to 5Bn3 may be surrounded by the second molding pattern 10b, sidewalls of the chips 5Cn1 to 5Cn3 may be surrounded by the third molding pattern 10c, and sidewalls of the chips 5Dn1 to 5Dn3 may be surrounded by the fourth molding pattern 10d.

Figure 1D:
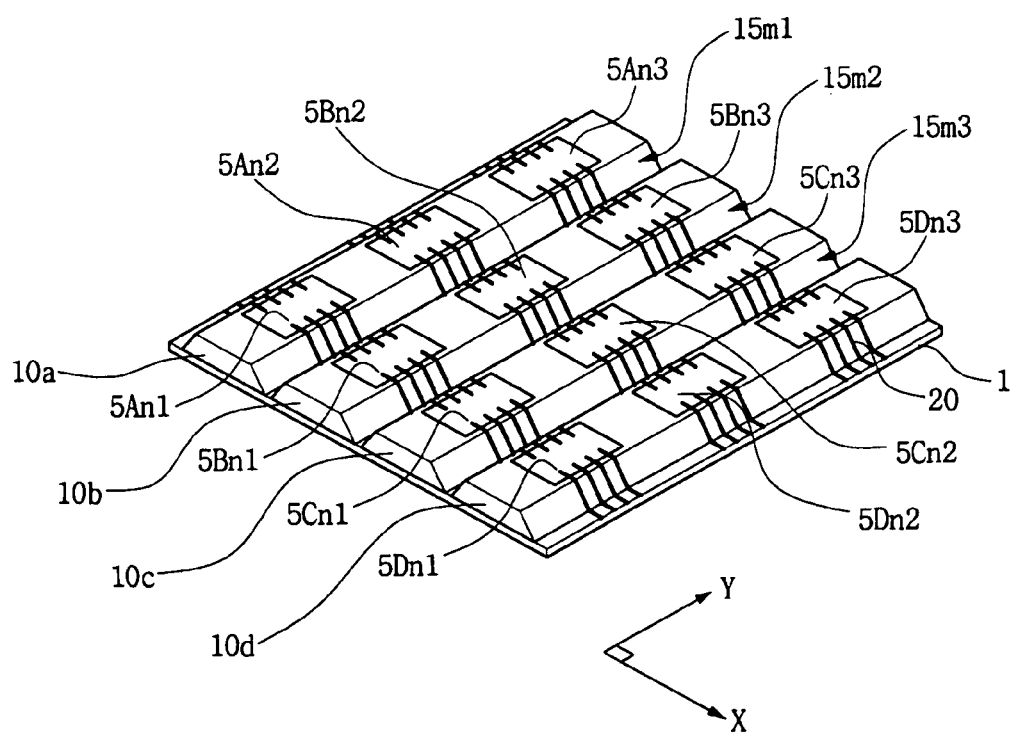

Referring to FIG. 1D, interconnections 20 may be formed on the substrate having the grooves 15m1, 15m2 and 15m3. The interconnections 20 may electrically connect at least two adjacent chips. For example, at least one of the interconnections 20 may cross at least one of the grooves 15m1, 15m2 and 15m3, and extend on the adjacent chips between which the groove is interposed. As such, the interconnections 20 may be in electrical contact with conductive regions, for example, pad regions, on the chips.

While example embodiments illustrate that the interconnections 20 are spaced a uniform distance apart from each other, example embodiments are not limited to any particular distance. For example, the interconnections 20 may be spaced a first distance apart from each other on the chips, and may be spaced a second distance apart from each other on the sidewalls of the grooves 15m1, 15m2 and 15m3. In an example embodiment, the second distance may be greater than the first distance. Also, the interconnections 20 may be spaced a uniform distance from each other on the sidewalls of the grooves 15m1, 15m2 and 15m3, and may be closer to each other as they come closer to the chips from the molding layer patterns 10a, 10b, 10c and 10d adjacent to the grooves 15m1, 15m2 and 15m3.

Figure 1E:
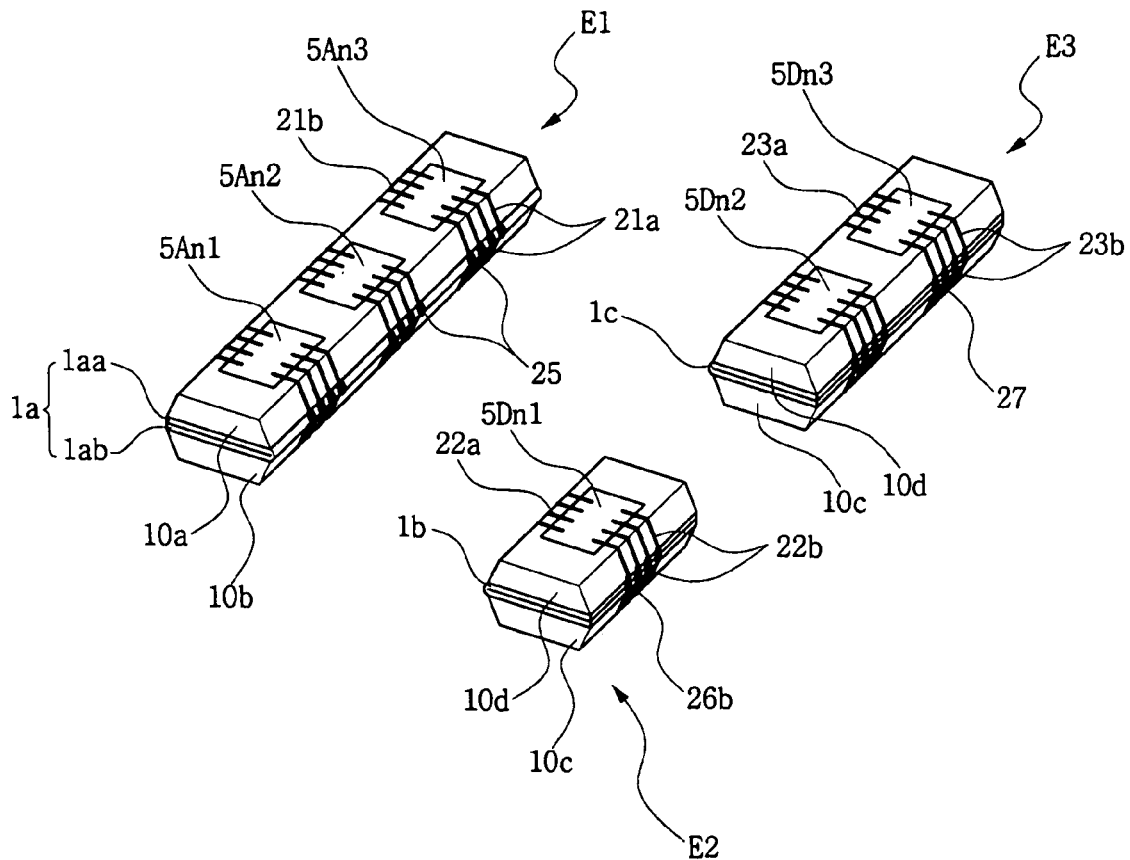

Referring to FIG. 1E, the substrate may be sawn along at least one of the odd- or even-numbered grooves 15m1, 15m2 and 15m3, for example, the groove 15m2 in FIG. 1D. Accordingly, the substrate may be separated into a plurality of unit substrates.

On at least one of the separated unit substrates, the chips 5An1, 5An2 and 5An3 arranged in the Y direction may be disposed at one side of the groove 15m1, and the chips 5Bn1, 5Bn2 and 5Bn3 arranged in the Y direction may be disposed at the other side thereof (with reference to FIG. 1D). Further, on another separated unit substrate, the chips 5Cn1, 5Cn2 and 5Cn3 may be disposed at one side of the groove 15m3 in the Y direction, and the chips 5Dn1, 5Dn2 and 5Dn3 may be disposed at the other side of the groove 15m3 in the Y direction (with reference to FIG. 1D).

A first substrate 1a may be formed by folding the separated unit substrates along the groove 15m1. Folding the separated unit substrates may include applying an adhering material such as an adhesive or an adhesive tape to bottom surfaces of the separated unit substrates, and adhering the bottom surfaces of the separated unit substrates along the groove 15m1. The chips 5An1 to 5An3 whose sidewalls are surrounded by the first molding pattern 10a may be disposed on one side 1aa of the first substrate 1a, and the chips 5Bn1 to 5Bn3 whose sidewalls are surrounded by the second molding pattern 10b may be disposed on the other side 1ab thereof. The first and second molding patterns 10a and 10b may have slanted sidewalls. For example, due to the slanted sidewalls of the grooves 15m1, 15m2 and 15m3, the first and second molding patterns 10a and 10b having sidewalls corresponding to the sidewalls of the grooves 15m1, 15m2 and 15m3 may also be formed to have slanted sidewalls as shown in FIG. 1E.

The first substrate 1a may be formed by folding the separated unit substrates. Thus, the interconnections 21a and 21b on the first substrate 1a may electrically connect two chips disposed on opposite sides of the first substrate 1a along one side of the first substrate 1a.

Also, while the separated unit substrates are folded along the groove 15m1, stress may be applied to the interconnections. Thus, a portion of the interconnections, to which the stress is applied, may deteriorate in endurance and/or reliability. A conductive structure 25 may be formed on the stress-applied interconnection portion. For example, the interconnections 21a disposed on the folded portion of the separated unit substrates, and particularly, on an edge portion of the bottom surface of the groove 15m1 may be damaged when the separated unit substrates are folded. As such, a first conductive structure 25 may be formed on the interconnections 21a on the folded portion of the separated unit substrates to improve endurance and/or reliability of the interconnections 21a.

The first conductive structure 25 may be formed only on portions including edges of the bottom surface of the groove 15m1, or may be formed to cover interconnections crossing the bottom surface of the groove 15m1 and interconnections disposed on the edges of the groove 15m1.

Moreover, interconnections 21b may be disposed on a first side surface of the first substrate 1a having the first conductive structure 25 and a second side surface of the first substrate 1a opposite to the first side surface thereof. Accordingly, the interconnections 21b are separated. For example, the interconnections 21b may have portions facing and/or spaced apart from one another on the basis of the substrate 1a. Thus, a second conductive structure (not shown) may be formed to electrically connect the separated interconnections 21b. The first and second conductive structures 25 may be formed by applying a molten metallic material to the first and/or second side surface of the substrate 1a and then solidifying the applied material. For example, the first and second conductive structures 25 may be formed by a jetting technique. Further, at least one of the first and second conductive structures 25 may be formed by jetting a metallic material such as solder.

Thus, for example, a first electronic part E1 including the chips 5An1 to 5An3 and 5Bn1 to 5Bn3, which are disposed on opposite sides of the first substrate 1a, and electrically connected by the interconnections 21a and 21b and the first and second conductive structures 25 may be formed.

Also, a predetermined region of the first electronic part E1, for example, a region between the chip 5An1 and the chip 5An2, may be sawn to form other electronic parts.

In an example embodiment, after folding the separated unit substrates along the groove 15m3, a predetermined region between the chips of the folded substrates may be sawn, thereby forming second and third substrates 1b and 1c. Alternatively, before folding the separated unit substrates, a predetermined region between the chips of the separated unit substrates may be sawn, and the separated and sawn substrates may be folded, thereby forming second and third substrates 1b and 1c.

For example, the sawn predetermined region of the folded substrate may be a region between the chips 5Dn1 and 5Dn2, as shown in FIG. 1D. Thus, the chip 5Dn1 whose sidewall is surrounded by the fourth molding pattern 10d may be disposed on one side of the second substrate 1b, and the chip 5Cn1 whose sidewall is surrounded by the third molding pattern 10c may be disposed on the other side. Accordingly, the chips 5Dn2 and 5Dn3 may be disposed on one side of the third substrate 1c, and the chips 5Cn2 and 5Cn3 may be disposed on the other side.

A third conductive structure (not shown) may be formed in a predetermined region of the second substrate 1b using substantially the same method as that of forming the first conductive structure of the first electronic part E1. For example, the third conductive structure (not shown) may be formed only on portions having edges of a bottom surface of the groove 15m3 (with reference to FIG. 1D). Alternatively, the third conductive structure (not shown) may be formed to cover interconnections 22a crossing a portion corresponding to the bottom surface of the groove 15m3 and the interconnections 22a on the edges of the groove 15m3. In addition, a fourth conductive structure 26b may be formed in a predetermined region of the second substrate 1b using substantially the same method as that of forming the second conductive structure of the first electronic part E1. For example, interconnections 22b are separated on opposite sides of the second substrate 1b on which the third conductive structure may be formed. In order to electrically connect the separated interconnections 22b, the fourth conductive structure 26b may be formed. Thus, for example, a second electronic part E2 having the chips 5Dn1 and 5Cn1, which are disposed on opposite sides of the second substrate 1b and electrically connected by the interconnections 22a and 22b and the third and fourth conductive structures 26b, may be formed.

Accordingly, a fifth conductive structure (not shown) may be formed in a predetermined region of the third substrate 1c using substantially the same method as that of forming the first conductive structure 25 of the first electronic part E1. For example, the fifth conductive structure (not shown) may be formed only on the portions including edges of the bottom surface of the groove 15m3 (with reference to FIG. 1D). Alternatively, the fifth conductive structure (not shown) may be formed to cover interconnections 23a crossing the bottom surface of the groove 15m3 and the interconnections 23a on the edges of the groove 15m3. In addition, a sixth conductive structure 27 may be formed in a predetermined region of the third substrate 1c using substantially the same method as that of forming the second conductive structure of the first electronic part E1. For example, interconnections 23b are separated on opposite sides of the third substrate 1c on which the fifth conductive structure may be formed. In order to electrically connect the separated interconnections 23b, the sixth conductive structure 27 may be formed. Thus, a third electronic part E3 having the chips 5Dn2 and 5Dn3, and 5Cn2 and 5Cn3, which are disposed on opposite sides of the third substrate 1c and electrically connected by the interconnections 23a and 23b and the fifth conductive structure and the sixth conductive structure 27, may be formed.

As described above, the first electronic part E1 having pairs of chips facing each other, or the second and third electronic parts E2 and E3 having two or more pairs of chips facing each other may be formed.

The general inventive concept is not limited to the example embodiment described with reference to FIG. 1E, and may be implemented in various different shapes. Hereinafter, an example embodiment implemented in a different shape from the above-described embodiment will be described with reference to FIG. 2.

Referring to FIG. 2, a plurality of unit substrates may be formed by sawing a substrate along the grooves 15m1, 15m2 and 15m3 of FIG. 1D, instead of sawing along an odd- or even-numbered groove among the grooves 15m1, 15m2 and 15m3 in FIG. 1D as described with reference to FIG. 1E. Also, the interconnections 20 shown in FIG. 1D may also be sawn while the substrate is sawn along the grooves 15m1, 15m2 and 15m3 of FIG. 1D.

Two of the plurality of sawn unit substrates may be selected, and bottom surfaces of the selected unit substrates 3a and 3b may be adhered to each other. For example, bottom surfaces of the unit substrate 3a on which chips 5An1, 5An2 and 5An3 arranged in a Y direction are disposed and bottom surfaces of the unit substrate 3b on which chips 5Bn1, 5Bn2 and 5Bn3 arranged in a Y direction are disposed may be adhered to each other. By adhering bottom surfaces of two different unit substrates 3a and 3b, a substrate 3 may be formed.

Because first interconnections 24a on the unit substrate 3a and second interconnections 24b on the unit substrate 3b face each other and are spaced apart from each other, a seventh conductive structure 28 may be formed to electrically connect the first and second interconnections 24a and 24b to each other. The seventh conductive structure 28 may be formed using substantially the same method as that of forming the fourth and sixth conductive structures 26b and 27 as described in example embodiments with reference to FIG. 1E.

Accordingly, a fourth electronic part E4 may be formed having chips which are disposed on opposite sides of the substrate 3 and electrically connected by first and second interconnections 24a and 24b and the seventh conductive structure 28. Further, the substrate 3 of the fourth electronic part E4 may be formed by adhering the bottom surfaces of the two separated unit substrates 3a and 3b. Thus, for example, the fourth electronic part E4 may include at least one chip arranged on one side of the substrate 3 and at least one chip arranged on the other side thereof.

In another example embodiment, after forming a plurality of unit substrates by sawing the substrate along the grooves 15m1, 15m2 and 15m3 of FIG. 1D, and forming other substrates by sawing at least one of the separated unit substrates along a predetermined region between chips arranged thereon, similar parts to the second and third electronic parts E2 and E3 may be formed. By the methods described in the above example embodiment, for example, similar parts may be formed by adhering bottom surfaces of the prepared substrates and forming a conductive structure electrically connecting the separated interconnections. Alternatively, similar parts to the second and third electronic parts E2 and E3 may be formed by sawing a predetermined region between the chips 5An1, 5An2 and 5An3 disposed on one side of the substrate 3, for example, a substrate between the chips 5An1 and 5An2, of the fourth electronic part E4, after forming the fourth electronic part E4.

An electronic device according to example embodiments will be described below with reference to FIGS. 3A to 3C.

Referring to FIG. 3A, similar to the description with reference to FIG. 1A, a plurality of chips 105An1, 105An2, 105An3; 105Bn1, 105Bn2, 105Bn3; 105Cn1, 105Cn2, 105Cn3; and 105Dn1, 105Dn2, 105Dn3 are arranged in X and Y directions and may be formed on a substrate 100. While example embodiments denote the plurality of chips as 105An1, 105An2, 105An3; 105Bn1, 105Bn2, 105Bn3; 105Cn1, 105Cn2, 105Cn3; and 105Dn1, 105Dn2, 105Dn as shown in FIGS. 3A-3C, example embodiments are not limited thereto. Accordingly, a greater or lesser number of chips may be included in the plurality of chips 5An1, 5An2, 5An3; 5Bn1, 5Bn2, 5Bn3; 5Cn1, 5Cn2, 5Cn3; and 5Dn1, 5Dn2, 5Dn3.

Also, among the chips arranged in the X direction, a distance between the chips 105An1 and 105Bn1 may be greater than that between the chips 105Bn1 and 105Cn1.

Subsequently, as described with reference to FIG. 1B, a molding layer may be formed on the substrate having the chips 105An1, 105An2, 105An3; 105Bn1, 105Bn2, 105Bn3; 105Cn1, 105Cn2, 105Cn3; and 105Dn1, 105Dn2, 105Dn3. Grooves may be formed between the chips arranged in the X direction among these chips 105An1, 105An2, 105An3; 105Bn1, 105Bn2, 105Bn3; 105Cn1, 105Cn2, 105Cn3; and 105Dn1, 105Dn2, 105Dn3. The grooves may cross the molding layer and divide it into first to fourth molding patterns 110a, 110b, 110c and 110d. Further, the grooves may be formed to taper to a lower region from an upper region. For example, the grooves may be formed to have a slanted sidewall. The slanted sidewall of each groove may be the molding layer, and a bottom surface of the groove may be a predetermined region of the substrate 100.

Odd- or even-numbered ones of the grooves may have a first bottom width W1, and the other grooves may have a second bottom width W2 smaller than the first bottom width W1. For example, the grooves may include grooves 115m1 and 115m3 having the first bottom width W1 and a groove 115m2 having the second bottom width W2. Thus, among the grooves, one groove 15m2 having the second bottom width W2 may be formed between two adjacent grooves 15m1 and 15m3 having the first bottom width W1.

Interconnections 120 may be formed on the substrate having the grooves 115m1, 115m2 and 115m3. The interconnections 120 may electrically connect at least two chips which are adjacent to each other. For example, at least one of the interconnections 120 may cross at least one of the grooves 115m1, 115m2 and 115m3, and extend on the adjacent chips disposed on opposite sides of at least one of the grooves 115m1, 115m2 and 115m3. The interconnections 120 may be in electrical contact with conductive regions, for example, pad regions, on the chips.

In the general inventive concept, a thickness from the bottom surface of the substrate 100 to the highest portion of the first to fourth molding patterns 110a, 110b, 110c and 110d, the chips 105An1, 105An2, 105An3; 105Bn1, 105Bn2, 105Bn3; 105Cn1, 105Cn2, 105Cn3; and 105Dn1, 105Dn2, 105Dn3 and the interconnections 120 may be represented as "t1". The thickness represented as "t1" may have substantially the same size as the first bottom width W1.

Referring to FIGS. 3B and 3C, a plurality of unit substrates may be formed by sawing the substrate along the groove 115m2 having a relatively smaller bottom width among the grooves 115m1, 115m2 and 115m3.

One of the separated unit substrates, for example, a first unit substrate 100a, may include a portion "A" having the chips 105An1 to 105An3 whose sidewalls are surrounded by the first molding pattern 110a, and a portion "B" having the chips 105Bn1 to 105Bn3 whose sidewalls are surrounded by the second molding pattern 110b.

Another one of the separated unit substrates, for example, a second unit substrate 100b, may include a portion "C" having the chips 105Cn1 to 105Cn3 whose sidewalls are surrounded by the third molding pattern 110c, and a portion "D" having the chips 105Dn1 to 105Dn3 whose sidewalls are surrounded by the fourth molding pattern 110d.

As described above, each of the grooves 115m1 and 115m3 (with reference to FIG. 3A) between the first and second molding patterns 110a and 110b may have the first bottom width W1.

Accordingly, when the first unit substrate 100a is folded to make the first and second molding patterns 110a and 110b face each other on the first unit substrate 100a, a bottom surface of the portion "A" of the first unit substrate 100a, having the first molding pattern 110a, may be spaced a first distance (L1) apart from the portion "B" of the first unit substrate 100a having the second molding pattern 110b. The space between bottom surfaces "A" and "B" further forms a first space S1. The first distance L1 may be determined by the first bottom width W1.

As such, when the second unit substrate 100b is folded to make the third and fourth molding patterns 110c and 110d face each other on the second unit substrate 110b, a bottom surface of the portion "C" of the second unit substrate 100b, having the third molding pattern 110c, may be spaced the first distance L1 apart from the portion "D" of the second unit substrate 100b having the fourth molding pattern 110d. The space between bottom surfaces "C" and "D" further forms a second space S2. The first and second spaces S1 and S2 may have the same size.

Heights of the portions "A", "B", "C" and "D" may be the same as that represented as "t1" shown in FIG. 3A. In addition, the heights of the first and second spaces S1 and S2 represented as "L1" shown in FIG. 3B may be the same as each other.

As described with reference to FIG. 3A, the first thickness "t1" may have substantially the same size as the first bottom width W1. Also, as described with reference to FIG. 3B, the first bottom width W1 may have substantially the same size as the first distance L1. Thus, at least one of the portions "A" and "B" of the first unit substrate 100a may be formed to be disposed in the second space S2, and at least one of the portions "C" and "D" of the second unit substrate 100b may be formed to be disposed in the first space S1. For example, before folding the first and second unit substrates 100a and 100b, an adhesive material such as an adhesive or an adhesive tape may be applied to bottom surfaces of the first and second unit substrates 100a and 100b. Accordingly, a bottom surface of the portion "B" of the first unit substrate 100a may be adhered to a bottom surface of the portion "C" of the second unit substrate 100b. The first unit substrate 100a may be folded to dispose a bottom surface of the portion "A" of the first unit substrate 100a on a chip in the portion "C" of the second unit substrate 100b. Also, the second unit substrate 100a may be folded to dispose a bottom surface of the portion "D" of the second unit substrate 100b on a chip in the portion "B" of the first unit substrate 100a.

Example embodiments explain that an electronic device having a stacked structure may be formed by folding the first and second unit substrates 100a and 100b, but it is not limited thereto. For example, an electronic device in which all or a portion of an electronic part such as a semiconductor chip, having a thickness equal to or smaller than the first distance L1, is inserted and may be formed in the first space S1 of the first unit substrate 100a. As such, the first unit substrate 100a may be folded to dispose all or a portion of an electronic part between the bottom surface of the portion "B" and the bottom surface of the portion "A" of the first unit substrate 100a. Furthermore, another conductive structure may be formed to electrically connect the electronic part formed in the first space S1 with interconnections on the first unit substrate 100a.

Referring to FIG. 3C, for convenience in description of an example embodiment: interconnections on the portion "A" of the first unit substrate 100a are defined as first interconnections 120a, interconnections on the portion "B" of the first unit substrate 100a are defined as second interconnections, interconnections on the portion "C" of the second unit substrate 100b are defined as a third interconnections 120c, and interconnections on the portion "D" of the second unit substrate 100b are defined as fourth interconnections 120d. In addition, interconnections between the portion "A" and the portion "B" on the first unit substrate 100a are defined as fifth interconnections, and interconnections between the portion "C" and the portion "D" on the second unit substrate 100b are defined as sixth interconnections 120f.

By substantially the same method as described with reference to FIG. 1E, conductive patterns may be formed to electrically connect selected chips at damaged and/or separated portions of interconnections electrically connecting these chips. For example, a first conductive structure 125a may be formed between interconnections facing and spaced apart from each other such as the first and third interconnections 120a and 120c. Also, because a portion in which the third interconnections 120c meet sixth interconnections 120f, and a portion in which the fourth interconnections 120d meet the sixth interconnections 120f, receive a stress during the process of folding the second unit substrate 100b, endurance and/or reliability may be deteriorated. Accordingly, a second conductive structure 125b may be formed on such portions. Thus, a fifth electronic part E5 in which a plurality of chips are arranged in vertical and parallel directions may be formed as shown in FIG. 3C.

Also, example embodiments may be implemented in a different shape, and is not limited to the description with reference to FIG. 3C. For example, several electronic parts may be formed by sawing a predetermined region of the fifth electronic part E5, i.e., a space between the chips 105Bn1 and 105Bn2. Alternatively, after forming the interconnections 120, a predetermined region of a substrate, for example, a substrate covering from a space between the chips 105An1 and 105An2 to a space between the chips 105Bn1 and 105Bn2, or from a space between the chips 105An1 and 105An2 to a space between the chips 105Dn1 and 105Dn2, may be sawn in any one of the steps performed before forming the fifth electronic part E5.

Next, an electronic device according to example embodiments will be described with reference to FIG. 4. While example embodiments will explain the second electronic part E2 of the first to fifth electronic parts E1, E2, E3, E4 and E5 below, instead of the second electronic part E2, the first, third, fourth and fifth electronic parts (E1, E3, E4 and E5) may be used, or other electronic parts formed by sawing the fourth and fifth electronic parts E4 and E5 may be used.

FIG. 4 is an example cross-sectional view of the second electronic part represented as "E2" (E2 of FIG. 1E), which was shown in the example perspective view, FIG. 1E. In the cross-sectional view of FIG. 4, reference numeral 26a may represent a third conductive structure formed to cover interconnections 22a crossing a predetermined portion of the substrate 1b corresponding to a bottom surface of the groove 15m3 (with reference to FIG. 1D) and to cover the interconnections 22a on a predetermined portion of the substrate 1b corresponding to edges of the groove 15m3 (refer to FIG. 1D).

An eighth electronic part MCM having at least three stacked chips may be formed by forming a seventh electronic part En on the second electronic part E2. The seventh electronic part En may have the same characteristics and size or have a different configuration from the second electronic part E2. For example, the seventh electronic part En may include at least one chip having different characteristics and/or sizes from chips of the second electronic part E2, and may be formed using the same process as that of forming the second electronic part E2. For example, the seventh electronic part En may include stacked chips EnC1 and EnC2 which respectively have different sizes from the chips 5Cn1 and 5Dn1 constituting the second electronic part E2. Alternatively, the seventh electronic part En may include a single-chip semiconductor package. While FIG. 4 shows that the chips EnC1 and EnC2 have different sizes and are stacked, example embodiments are not limited thereto. For example, the chips EnC1 and EnC2 may have the same size as each other, and have characteristics equal to or different from each other. The seventh electronic part En may include interconnections 222a and 222b, conductive structures 226a and 226b and a molding pattern 210b respectively corresponding to the interconnections 22a and 22b, the conductive structures 26a and 26b, and the molding patterns 10c and 10d of the second electronic part E2.

The second electronic part E2 and the seventh electronic part En may be electrically connected by connecting structures 40. For example, the connecting structures 40 may be interposed between the interconnections 22a and 22b of the second electronic part E2 and the interconnections 222a and 222b of the seventh electronic part En to connect the second and seventh electronic parts E2 and En.

The general inventive concept may be implemented in a different shape without being limited to example embodiments as described above. At least one of the electronic parts described above, for example, the second electronic part E2, may be mounted on a printed circuit board 50 (with reference to FIG. 5). The second electronic part E2 and the printed circuit board 50 may be electrically connected by a connecting structure 55. Alternatively, to minimize a thickness of the printed circuit board, at least one of the electronic parts described above, for example, the second electronic part E2 may be mounted in a groove 60a in the printed circuit board 60 (with reference to FIG. 6).

According to example embodiments, a method of forming interconnections on respective stacked chips, in one process, and in an electronic device having the stacked chips is provided. Accordingly, productivity of the electronic device may be improved.

While example embodiments have been particularly shown and are disclosed herein, it should be understood that other variations may be possible. Such variations are not to be regarded as a departure from the spirit and scope of example embodiments of the present application, and all such modifications as would be obvious to one skilled in the art are intended to be included within the scope of the following claims.

What is claimed is:

1. A method of fabricating an electronic device, comprising:
    forming first and second chips spaced apart from each other on a substrate;
    forming interconnections electrically connecting the first and second chips;
    folding the substrate between the first and second chips;
    forming a molding layer between the first and second chips before forming the interconnections; and
    forming a groove between the first and second chips before forming the interconnections.

2. The method of claim 1, further comprising:
    adhering a first bottom surface of the substrate to a second bottom surface of the substrate to form a stacked semiconductor package, where the first chip is disposed on the first bottom surface and the second chip is disposed on the second bottom surface.

3. The method of claim 1, wherein folding the substrate between the first and second chips includes,
    folding the substrate to form a space between first and second bottom surfaces of the substrate, where the first chip is disposed on the first bottom surface and the second chip is disposed on the second bottom surface,
    forming an electronic part in the space formed between the first and the second bottom surfaces of the substrate.

4. The method of claim 1, further comprising:
    forming a conductive structure on a portion of the interconnection where a stress is applied due to the substrate being folded.

5. The method of claim 1, further comprising:
    forming a conductive structure electrically connecting interconnections on the first and second chips at the folded portion of the substrate, the interconnections being spaced apart from each other and disposed on opposite sides of the folded substrate.

6. The method of claim 1, further comprising:
    preparing a printed circuit board; and
    mounting the folded substrate, the mounting of the folded substrate being at least one of on and in the printed circuit board.

7. A method of fabricating an electronic device, comprising:
    forming a plurality of chips arranged in a row direction and at least one chip arranged in a column direction on a substrate;
    forming a molding layer between the at least one of the plurality of chips arranged in the row direction and the at least one chip arranged in the column direction;
    forming grooves in the molding layer between the plurality of chips arranged in the row direction, respectively;
    forming conductive interconnections on portions of the substrate having the grooves;
    sawing the substrate along at least one of an odd-numbered and even-numbered groove of the grooves to separate the substrate into a plurality of unit substrates; and
    folding at least one of the separated unit substrates along an unsawn groove of the grooves, where the unsawn groove is not sawed.

8. The method of claim 7, wherein
    forming the at least one chip arranged in the column direction on the substrate to
include forming a plurality of chips arranged in the column direction on the substrate, and
    sawing the substrate to include sawing the substrate between the plurality of chips arranged in the column direction.

9. The method of claim 7, wherein
    each of the grooves has a slanted sidewall tapering to a lower region from an upper region, and
    the interconnections cross the each of the grooves and electrically connect the plurality of chips disposed at first and second sides of the each of the grooves.

10. The method of claim 7, further comprising:
    adhering a first bottom surface of the at least one of the folded unit substrates to a second bottom surface of the at least one of the folded unit substrates; and
    forming an electronic part on the at least one of the folded unit substrates.

11. The method of claim 7, further comprising:

forming a conductive structure on portions of the interconnections where a stress is applied due to the at least one of the unit substrates being folded.

12. The method of claim 7, further comprising:

forming a conductive structure electrically connecting interconnections at least one of facing and spaced apart from each other, the conductive structure being formed between the interconnections disposed on opposite sides of the at least one of the unit substrates and spaced apart from each other when the at least one of the unit substrates is folded.

13. The method of claim 7, wherein among the grooves, the folded groove is formed to have a first width, and the sawn groove is formed to have a second width smaller than the first width.

14. The method of claim 13, wherein folding the at least one of the unit substrates includes, disposing first and second chips of the plurality of chips at opposite sides of the folded groove; and forming a space where a first bottom surface of the at least one of the unit substrates having the first chip is spaced a first distance apart from a second bottom surface of the at least one of the unit substrates having the second chip.

15. The method of claim 14, further comprising:

forming an electronic part at least one of partially and entirely in the space; and forming a conductive structure electrically connecting at least one of the interconnections on the plurality of chips arranged in the row direction with the electronic part.

16. A method of fabricating an electronic device, comprising:

forming a plurality of chips arranged in a row direction and at least one chip arranged in a column direction on a substrate;

forming a molding layer between the plurality of chips and the at least one chip;

forming grooves in the molding layer between the plurality of chips arranged in the row direction;

forming interconnections crossing one first groove of the grooves and electrically connecting the plurality of chips adjacent to the first groove;

sawing the substrate along the first groove to form unit substrates;

adhering bottom surfaces of the sawn unit substrates; and forming at least one conductive structure electrically connecting interconnections on at least one sidewall of the adhered unit substrates.

17. The method of claim 16, further comprising:

forming the at least one chip arranged in the column direction on the substrate to include forming a plurality of chips arranged in the column direction on the substrate; and sawing the substrate between the plurality of chips arranged in the column direction on the substrate.

18. The method of claim 16, wherein each groove of the grooves has a slanted sidewall tapering to a lower region from an upper region.

19. The method of claim 16, further comprising:

forming the at least one conductive structure to include forming conductive structures electrically connecting the interconnections facing each other on the at least one sidewall of the adhered unit substrates.

* * * * *